May 1, 1962 R. J. GREEN 3,031,747

METHOD OF FORMING OHMIC CONTACT TO SILICON

Filed Dec. 31, 1957

INVENTOR
RALPH J. GREEN
BY
Eyre Mann & Lucas
ATTORNEYS 3,031,747
Patented May 1, 1962

3,031,747

METHOD OF FORMING OHMIC CONTACT TO SILICON

Ralph J. Green, Newark, N.J., assignor to Tung-Sol Electric Inc., a corporation of Delaware Filed Dec. 31, 1957, Ser. No. 706,311
4 Claims. (Cl. 29—473.1)

The present invention relates to silicon and more particularly to semiconductor devices incorporating silicon, such as crystal diodes and transistors, and comprises an improved method of forming the ohmic contact to an n-type silicon crystal of such devices.

Ohmic contacts to n-type silicon crystals are ordinnarily made by placing the crystal in contact with gold having a small amount of antimony alloyed therewith. The antimony present in the gold serves as the impurity to form the n+ part of the contact with respect to the n-type silicon and also tends to improve the surface wetting properties of gold on silicon. The concentration of antimony is usually kept low because antimony in gold tends to form an alloy that is hard and brittle and thus difficult to draw and because antimony tends to reduce the solubility of silicon in gold. When gold alloyed with a sufficient amount of antimony to improve the wetting properties is heated in contact with silicon the alloy readily wets the silicon around the area of contact but does not spread over the silicon because as soon as saturation is reached, the alloy separates from the silicon leaving many surface cavities. The method of the present invention avoids the above described difficulties inherent in use of antimony gold alloys of high antimony content while obtaining the advantage of good wetting properties of such high antimony content alloys.

In accordance with the invention, an ohmic contact to silicon is made by bonding to the silicon crystal a strip of metal having a temperature coefficient of expansion substantially matching that of silicon by the intermediary of a composite layer of gold and of gold-antimony alloy so formed that the total antimony content is low but the concentration thereof is initially relatively high at the surface which is brought into contact with the silicon. By this procedure, the total antimony content is maintained low enough to insure good solubility of silicon in gold, whereas the initial surface concentration of the antimony is high enough to insure good wetting of the silicon by the alloy.

The composite gold and gold-antimony layer may be formed by first plating the metal strip with pure gold or very low antimony content alloy of gold and antimony and then plating the first layer with a thinner layer of gold-antimony alloy of relatively high antimony content. Preferably, before fusing to the silicon crystal, the plated strip is annealed and the plated surface mechanically treated, as by pounding, to smooth the alloy surface and to cause some penetration of the alloy layer into the lower layer.

The gold and gold-antimony layers may be deposited in any known manner, for example, electrolytically, or by vacuum techniques or by cladding techniques.

For a better understanding of the invention reference may be had to the accompanying drawing of which:

Although the process of the invention can be carried out in a variety of ways the details of a specific procedure will now be given.

A piece of Kovar sheet having the desired contact area and about 0.01" thick is cleaned by first degreasing with an organic solvent and then pickling in an acid such as hydrochloric acid. Kovar is a nickel, cobalt and iron alloy that has a temperature coefficient of expansion which substantially matches silicon. The cleaned sheet is then water rinsed and plated with pure gold to a thickness of about 0.001" using a regular cyanide-gold plating solution. Such solution may contain gold cyanide 8.4 parts, potassium cyanide 11 parts of which latter 8 parts are free cyanide. A temperature of about 70° C. is employed and a current density of 4 A.S.F.

Figure 1:
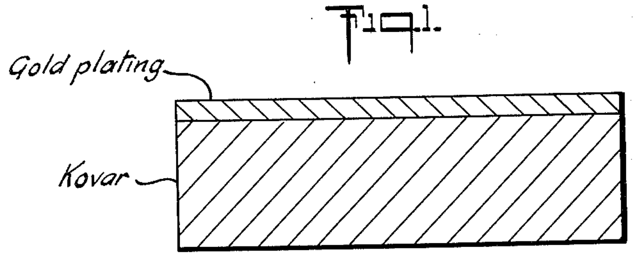
FIG. 1 is a diagram representing the first step of the process, namely the plating of a metal strip with gold.
Figure 2:
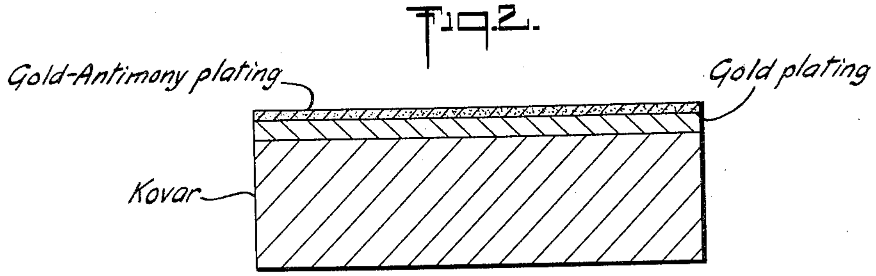
FIG. 2 illustrates diagrammatically the second step of the process in which the gold plating on the strip is plated in turn with a gold-antimony alloy.

FIG. 1 represents diagrammatically the completion of the step wherein the Kovar strip is plated with pure gold. In the next step of the process the plated Kovar is given a plating of gold-antimony by plating under the same conditions and with the same kind of gold plating solution but to which a small amount of antimony potassium tartrate has been added. The thickness of the gold-antimony plating should be such that the antimony content is from 0.001% to 1.0% of the total plating on the Kovar. For example, with a gold layer of 0.001" in thickness, a layer of gold-antimony of 0.0005" in thickness and of 1.5% antimony content, or a layer of gold-antimony of 0.0001" in thickness and 5.5% antimony content, will yield about 0.5% antimony content of the total plating. The doubly plated Kovar strip is then rinsed free of the plating solution, dried and pounded between two steel blocks during which pounding the gold-antimony plating, which is powdery in structure, is smoothed out and pressed slightly into the gold plating.

Figure 3:
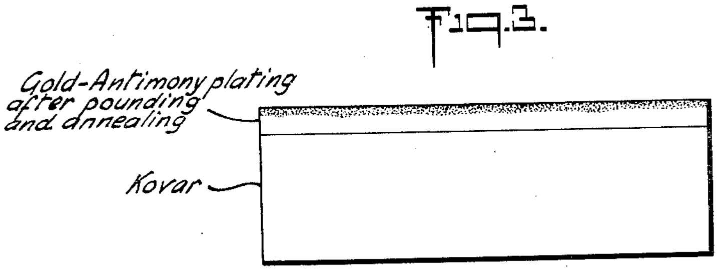
FIG. 3 represents diagrammatically the condition of the plated strip after the plated layers have been pounded and annealed.
Figure 4:
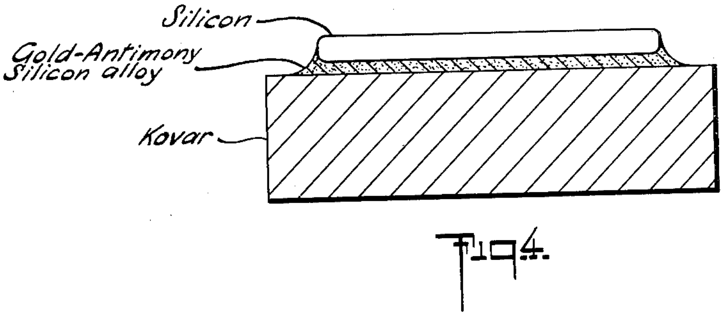
FIG. 4 represents diagrammatically the final product with the completed ohmic contact to silicon.

The plated Kovar sheet is then annealed in hydrogen for about one minute at 500° C. to cause slight penetration of the antimony into the gold plating on the Kovar surface. FIG. 3 represents the doubly plated Kovar after pounding and annealing. After the annealing step the plating is again pounded flat between steel blocks and the pressed plated surface cleaned by dipping for one minute in a solution of hydrofluoric and nitric acids (preferably 2 parts of hydrofluoric to 1 part of nitric acid). After rinsing and drying of the plated Kovar sheet a freshly etched clean N-type silicon single crystal is placed in contact with the plated Kovar sheet and the two are heated to about 400° C. in hydrogen until the antimony-gold plating melts and wets the silicon. The parts are then cooled and the product is complete. FIG. 4 represents the completed ohmic contact.

By the above described method the reactivity towards silicon is greatly increased because of the high surface concentration of the antimony in the Kovar plating. The gold readily spreads over the silicon because as the gold alloys with the silicon and melts, the antimony distributes itself throughout the plating giving it a uniform antimony concentration so low that the solubility of the silicon in gold is not substantially impaired.

Specific details of one method of carrying out the invention have now been given. The invention, however, resides in the concept of a non-uniform distribution of antimony in gold with the high antimony concentration in the surface to be first brought into contact with the silicon, the total antimony content being low. Whether the non-uniform distribution is obtained by electrolytic plating, as specifically described herein, or by cladding or by vapor deposition is immaterial. Obviously, if plating by electrolytic bath is to be employed specific proportions and ingredients other than those suggested could be used.

The following is claimed:

1. The method of making an ohmic contact to an N-type silicon crystal which comprises coating a metal terminal element with a composite layer of gold and gold-antimony alloy in which the antimony concentration is at least 1.5% at the surface remote from the terminal element and in which the total antimony content is from 0.001% to 1.0% of the composite layer, placing a silicon crystal in contact with the coating and heating the assembly to fuse the silicon crystal to the coating.

2. The method of making an ohmic contact to an N-type silicon crystal which comprises plating a metal strip with a layer of gold, plating the gold layer with a thinner layer of gold-antimony alloy of antimony content of at least 1.5%, annealing the plated strip to cause partial penetration of the alloy layer into the gold layer and then fusing a silicon crystal to the surface of the alloy layer.

3. The method according to claim 2 wherein the antimony content of the alloy is maintained at less than 1% of the total coating on the metal strip.

4. The method of making an ohmic contact to an n-type silicon crystal which comprises plating a metal strip with a layer of gold, plating the gold layer with a thinner layer of a gold-antimony alloy having an antimony content such that the total antimony of the two layers is between 0.001% and 1.0%, annealing the plated strip in hydrogen for about one minute at about 500° C., mechanically treating the annealed plating to cause penetration of the antimony into the layer of gold, then placing a silicon crystal in contact with the plating on the strip and heating the assembly at about 400° C. in hydrogen until the antimony-gold plating melts and wets the silicon.

References Cited in the file of this patent

UNITED STATES PATENTS

| | | |
|---|---|---|
| 2,801,375 | Losco | July 30, 1957 |
| 2,854,612 | Zaratkiewicz | Sept. 30, 1958 |
| 2,898,528 | Patalong | Aug. 4, 1959 |
| 2,916,806 | Pudvin | Dec. 15, 1959 |
| 2,934,685 | Jones | Apr. 26, 1960 |